United States Patent [19]
Quach

[11] Patent Number: 5,950,220
[45] Date of Patent: Sep. 7, 1999

[54] METHOD AND APPARATUS FOR PROVIDING A LOGICAL DOUBLE SIDED MEMORY ELEMENT BY MAPPING SINGLE SIDED MEMORY ELEMENTS ONTO A LOGICAL DOUBLE SIDED MEMORY ADDRESS SPACE

[75] Inventor: Tuan M. Quach, Portland, Oreg.

[73] Assignee: Intel Corporation, Santa Clara, Calif.

[21] Appl. No.: 08/766,242

[22] Filed: Dec. 13, 1996

[51] Int. Cl.$^6$ ............................... G06F 12/00; G11C 5/06
[52] U.S. Cl. .................................................. 711/5; 711/157
[58] Field of Search ............................... 365/52, 230.03, 365/230.04; 711/5

[56] References Cited

U.S. PATENT DOCUMENTS

| | | | |
|---|---|---|---|
| 4,893,279 | 1/1990 | Rahamn et al. | 365/230.03 |
| 5,446,691 | 8/1995 | North et al. | 365/230.03 |
| 5,579,277 | 11/1996 | Kelly | 365/230.02 |
| 5,621,678 | 4/1997 | Barnaby et al. | 365/52 |
| 5,765,182 | 12/1998 | Lau et al. | 711/5 |

*Primary Examiner*—Eddie P. Chan
*Assistant Examiner*—Yamir Encarnacion
*Attorney, Agent, or Firm*—Kenyon & Kenyon

[57] ABSTRACT

A mapping unit is described for use in a computer system having a multiple bank memory. Each bank of the multiple bank memory includes a plug-in socket defining first and second memory rows. The mapping unit maps a memory control signal for the second row of a first socket adapted to mount one of a single-sided memory element or a double-sided memory element, to the first row of a second socket adapted to mount one of a single-sided memory element or a double-sided memory element, to provide a logical double-sided memory element when single-sided memory elements are plugged into the sockets. A poll routine in the computer system operates to determine the existence of single-sided memory elements in each of the first socket and the second socket, and asserts a select signal when the determination is positive. A multiplexer is provided in the multiple bank memory to receive the select signal from the poll routine and selectively couple the memory control signal for the second row of the first socket to the first row of the second socket, as a function of the select signal.

11 Claims, 5 Drawing Sheets

METHOD AND APPARATUS FOR PROVIDING A LOGICAL DOUBLE SIDED MEMORY ELEMENT BY MAPPING SINGLE SIDED MEMORY ELEMENTS ONTO A LOGICAL DOUBLE SIDED MEMORY ADDRESS SPACE

FIELD OF THE INVENTION

The present invention is directed to a computer system having a memory and more particularly, to a computer system having a multiple bank memory board.

BACKGROUND OF THE INVENTION

Modern computer workstation and server systems include multiple bank memory boards to provide flexibility in configuring dynamic random access memory (DRAM) capacity. Generally, a multiple bank memory board comprises rows of plug-in type connector elements adapted to mount and electrically connect individual plug-in memory elements such as single in-line memory modules, sometimes referred to as SIMM memory components. Each SIMM memory component comprises a plug-in board unit and includes a row or rows of DRAM memory elements mounted in-line on the board. The SIMM memory plug-in board is provided with a single connector designed to mate with one of the plug-in type connectors of the multiple bank memory to couple all of the DRAM's mounted on the SIMM to the memory board.

As is generally known, the multiple bank memory board includes on-board memory control electronics coupled to the plug-in type connectors of the board to control access to the DRAM's of the SIMM memory components plugged into the board, and to control the transfer of data to and from the DRAM's. The on-board memory control electronics is, in turn, adapted to be coupled to the memory management system of the workstation or server.

A user can selectively configure the total DRAM capacity of a workstation or server by plugging in a selected number of SIMM's that, together, provide the desired amount of memory capacity. To that end, SIMM components are commercially available in single-sided and double-sided configurations. In a single-sided SIMM, DRAM's are mounted on one side only of the SIMM plug-in board. In a double-sided SIMM, DRAM's are mounted on both sides of the SIMM plug-in board. Thus, a double-sided SIMM may be configured to have twice the memory capacity of a single-sided SIMM.

Commercially available multiple bank memory boards are designed to support both single-sided and double-sided SIMM's. The plug-in type connectors each define two rows of the memory board. A particular bit in a row address portion of a memory address designates which of the two rows assigned to the particular connector are to be accessed. In this manner, when a double-sided SIMM is plugged into the connector, the on-board memory control electronics can access the DRAM's of either side of the SIMM via the row designation bit for the two rows assigned to the individual plug-in type connector mounting the double-sided SIMM. When a single-sided SIMM is plugged into a plug-in type connector of the board, the second row of the connector is treated as being vacant. Thus, if two double-sided SIMM's are mounted on the memory board, the workstation or server can address memory locations of the DRAM's by selective reference to either one of rows 0, 1 for the first of the double-sided SIMM's, and rows 2 and 3 for the second of the double-sided SIMM's. However, if two single-sided SIMM's are mounted on the memory board, only rows 0 and 2 will be referenced, with rows 1 and 3 being treated as vacant.

Workstations and servers having multiple bank memory boards include a basic input/output system (BIOS) that polls the board at reset to determine the types of SIMM's mounted on the board. The information obtained by the BIOS is used by the memory management system of the workstation or server to control row selection. Thus, in the above example, when the double-sided SIMM's are mounted on the board, the BIOS determines the existence of the two sided configuration, and memory accesses are made with reference to rows 0, 1, 2 and 3. If, on the other hand, single-sided SIMM's are detected, the memory management system only utilizes rows 0 and 2 when accessing the DRAM's.

According to known DRAM operating characteristics, the DRAM must be repeatedly precharged to maintain electrical representations of the data stored in the DRAM. Precharge of a DRAM may increase memory access time during periods when repeated accesses are made to the same DRAM or row of DRAM's in the case of a SIMM arrangement. This is because memory address control signals are deasserted during precharge. Generally, during consecutive accesses to the same row of DRAM's, a precharge period is inserted between memory accesses to deassert memory control signals and precharge the DRAM's. This adds to the overall time for memory access operations.

A known technique for reducing memory access time is used in multiple bank memory board arrangements when double-sided SIMM's are mounted on the board. The memory address bit used to designate which of the two rows assigned to a particular plug-in type connector contains the DRAM being accessed is permutated to a memory address position that is toggled frequently. Thus, as memory accesses continue, there is a frequent change in the memory address bit designating the row, thereby causing a frequent change of the row where the DRAM to be accessed is located. Accordingly, the DRAM's of the row not being accessed may be precharged during the time of access to the DRAM's of the other row. It is therefore not necessary to wait for a precharge to be completed between certain successive pairs of access operations because row accesses are alternated on a frequent basis.

As should be understood, the technique for reducing memory access time used in configurations having double-sided SIMM's cannot be used when single-sided SIMM's are mounted in the multiple bank memory board. Thus, a series of accesses to DRAM's of the SIMM will include precharge periods interspersed between accesses. A need, therefore, exists for a technique for reducing memory access time when single-sided SIMM's are mounted in the multiple bank memory board.

SUMMARY OF THE INVENTION

Briefly, in accordance with an embodiment of the present invention, a system and method are provided to implement an address permutation scheme by using a mapping of a single-sided SIMM configuration onto a logical double-sided SIMM address space as an alias address space for the single sided SIMM's. The logical two sided SIMM address space may then be used according to the address bit permutation technique to reduce memory access times.

In one embodiment, the present invention comprises a poll routine in the workstation or server BIOS that, in addition to determining the SIMM configuration of the memory board, controllably asserts a select control signal used to cause an automatic mapping of a single sided SIMM configuration onto the logical double-sided SIMM memory address space when single sided SIMM's are detected by the BIOS poll routine. A mapping unit is implemented in row control signal portions of the on-board electronics of the multiple bank memory board to provide a mapping mechanism for row control signals, as a function of the BIOS generated select control signal.

For example, in one embodiment of the present invention, the mapping unit comprises a multiplexer arrangement that provides alternate signal paths for Row Address Strobe signals (RAS). An individual RAS signal is coupled to each row in the multiple bank memory board. Each RAS signal is used to control access to a respective row when the row address portion of a memory address designates the row corresponding to the particular RAS. Thus, an RAS is provided for each of rows 0, 1, 2, and 3 in the example discussed above. In any particular memory access, the RAS corresponding to the row containing the DRAM where the addressed data is located, is asserted. In the case of double-sided SIMM's, all of the RAS signals are used in memory accesses since all of rows 0, 1, 2 and 3 contain DRAM's. However, in the case of single-sided SIMM's, the RAS signals for rows 1 and 3 are not asserted in current implementations of multiple bank memory boards since rows 1 and 3 are treated as being vacant.

According to a feature of of an embodiment of the present invention, the multiplexer arrangement selectively couples, e.g., the RAS for row 1 to each of rows 1 and 2. The BIOS generated select control signal causes the multiplexer arrangement to couple the RAS signal for row 1 to row 1 when double-sided SIMM's are detected on the memory board, and to couple the RAS signal to row 2 when single-sided SIMM's are detected. This arrangement provides a logical double-sided SIMM element comprising the two single rows of a pair of adjacent single-sided SIMM's, with row 0 designating actual row 0 of the first SIMM of the pair and actual row 2 of the other SIMM of the pair substituting for vacant row 1 and, thus, acting as an alias for row 1. The memory management system of the workstation or server may then consistently address memory locations on the basis of a double-sided SIMM configuration, and place the memory address bit designating the two rows of the logical double-sided SIMM in a frequently toggled position. In this manner, the reduced access time technique for double-sided SIMM's may be used regardless of whether a single-sided or double-sided SIMM configuration is detected on the memory board.

DETAILED DESCRIPTION

Figure 1:
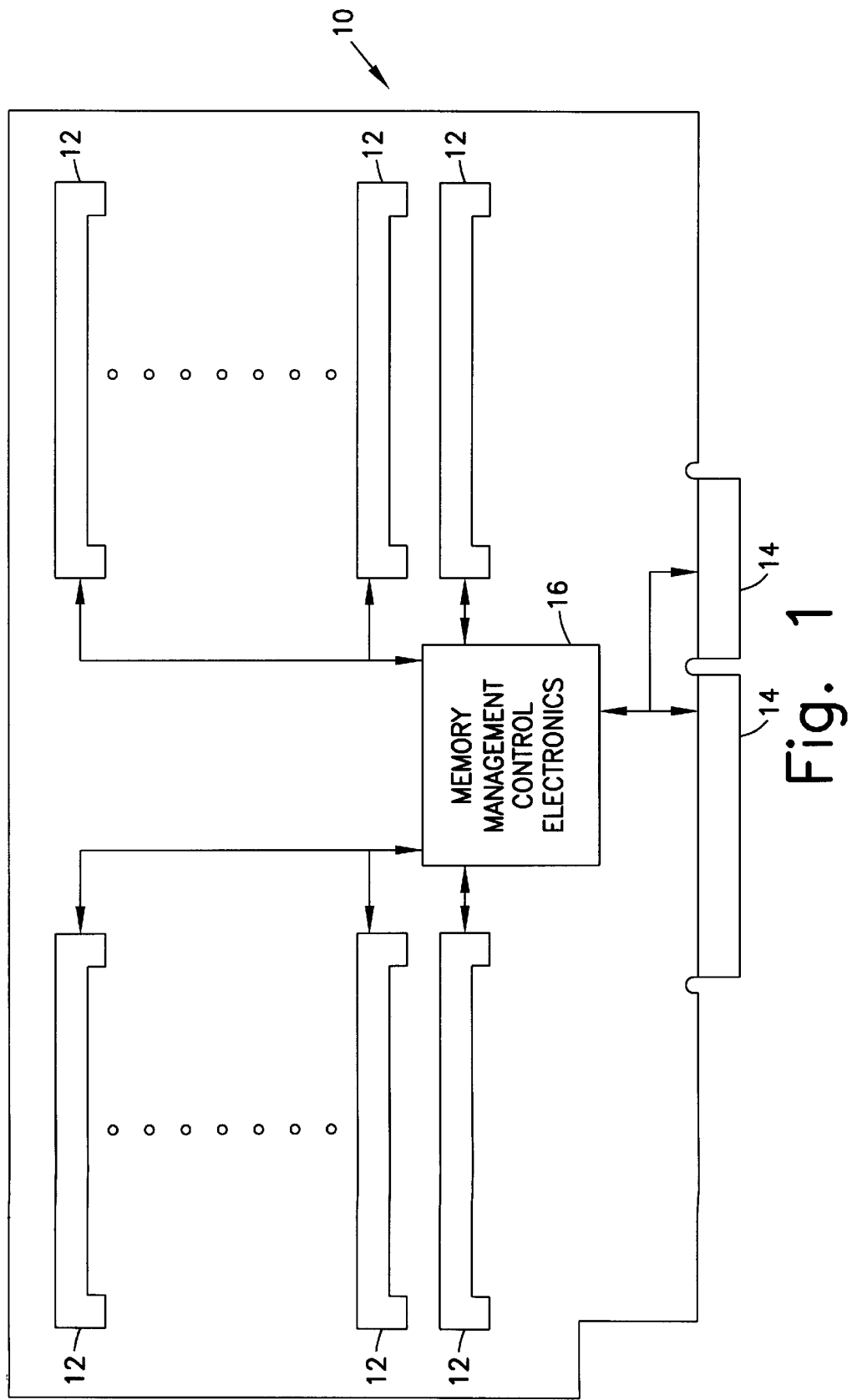
FIG. 1 is a block diagram of an embodiment of a multiple bank memory board.

Referring now to the drawings, and initially to FIG. 1, there is illustrated a multiple bank memory board designated by the reference numeral 10. The memory board 10 includes a series of plug-in sockets 12 defining a row arrangement for receiving plug-in SIMM memory units. A connector strip 14 is adapted to plug into a mating plug element within a housing of a computer workstation or server (not shown) in a conventional manner, to provide a memory component for the computer. On-board memory control electronics is represented by a block 16. The on-board electronics 16 couples the connector strip 14 to the plug-in sockets 12 to cause memory address and control signals from a memory management system of the computer to transfer data between the computer and SIMM memory units plugged into the plug-in sockets 12 of the board 10, as is generally known. The multiple bank memory board 10 affords a user considerable flexibility in configuring a memory since the capacity of the memory may be set simply by selecting and plugging in a suitable number of SIMM units to obtain the total memory capacity desired by the user.

Figure 2:
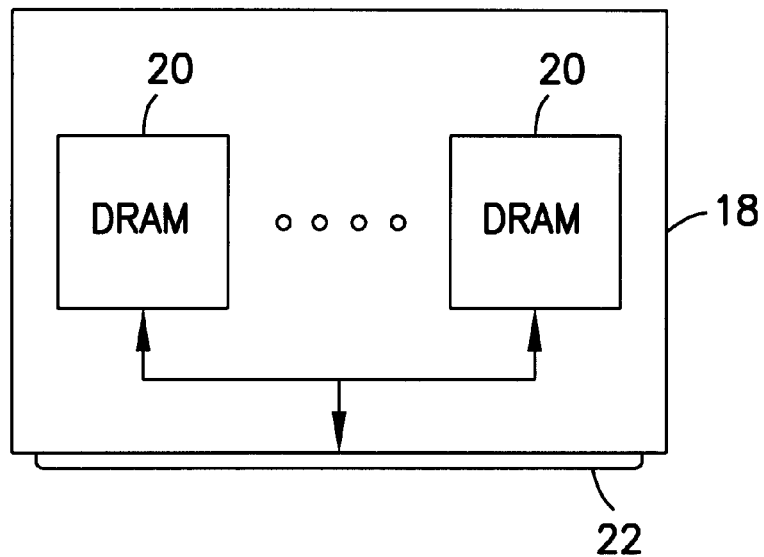
FIG. 2 is a block diagram showing a top view of an embodiment of a SIMM memory board, including DRAM's mounted on the SIMM.
Figure 3:
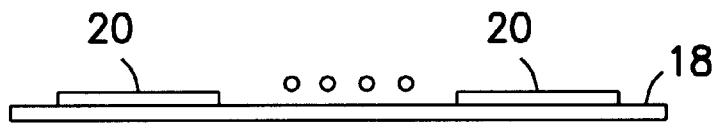
FIG. 3 is a block diagram showing a side view of the SIMM of FIG. 2, when the SIMM is arranged as a single-sided SIMM.
Figure 4:
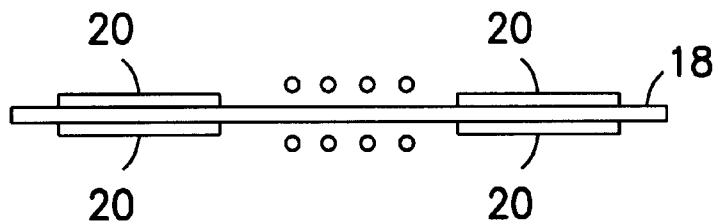
FIG. 4 is a block diagram showing a side view of the SIMM of FIG. 2, when the SIMM is arranged as a double-sided SIMM.

FIGS. 2–4 illustrate SIMM memory units arranged to be plugged into the sockets 12 of the multiple bank memory board 10. A board 18 mounts a series of DRAM memories 20 and includes a connector element 22 coupled to the DRAM's and adapted to mate with a corresponding plug-in socket 12 of the memory board 10 (FIG. 2). The connector element 22 couples the DRAM's 20 to the on-board electronics 16 of the memory board 10 via the respective plug-in socket 12 mounting the SIMM board 18.

As shown in the side views of FIGS. 3 and 4, a SIMM can be configured as either a single-sided SIMM or a double-sided SIMM. A single-sided SIMM is illustrated in FIG. 3, and includes the board 18 arranged to mount the DRAM's 20 on one side only of the board 18. Thus, the SIMM board 18 provides a single row of DRAM's 20, designated as row 0. FIG. 4 illustrates a double-sided SIMM wherein the board 18 mounts DRAM's 20 on each side to provide two rows of DRAM's, designated as rows 0 and 1. The total memory capacity per row of the SIMM may range, e.g., from 16–64 megabytes. Accordingly, a single-sided SIMM may have memory capacities of 4, 16 or 64 megabytes, for example, and a double-sided SIMM may have memory capacities of 8, 32 or 128 megabytes, for example.

Each socket 12 of the memory board 10 and the on-board electronics 16 are designed to support either a single-sided or double-sided SIMM, and accordingly there are two row designations per socket 12. The memory control functions of the on-board electronics 16 may transmit memory address and control signals to each of row 0 and row 1 of a first socket 12. A second socket 12 includes row designations 2 and 3, and each succeeding socket 12 will have numerically increasing row designations, two per socket 12, as discussed above.

Figure 5:
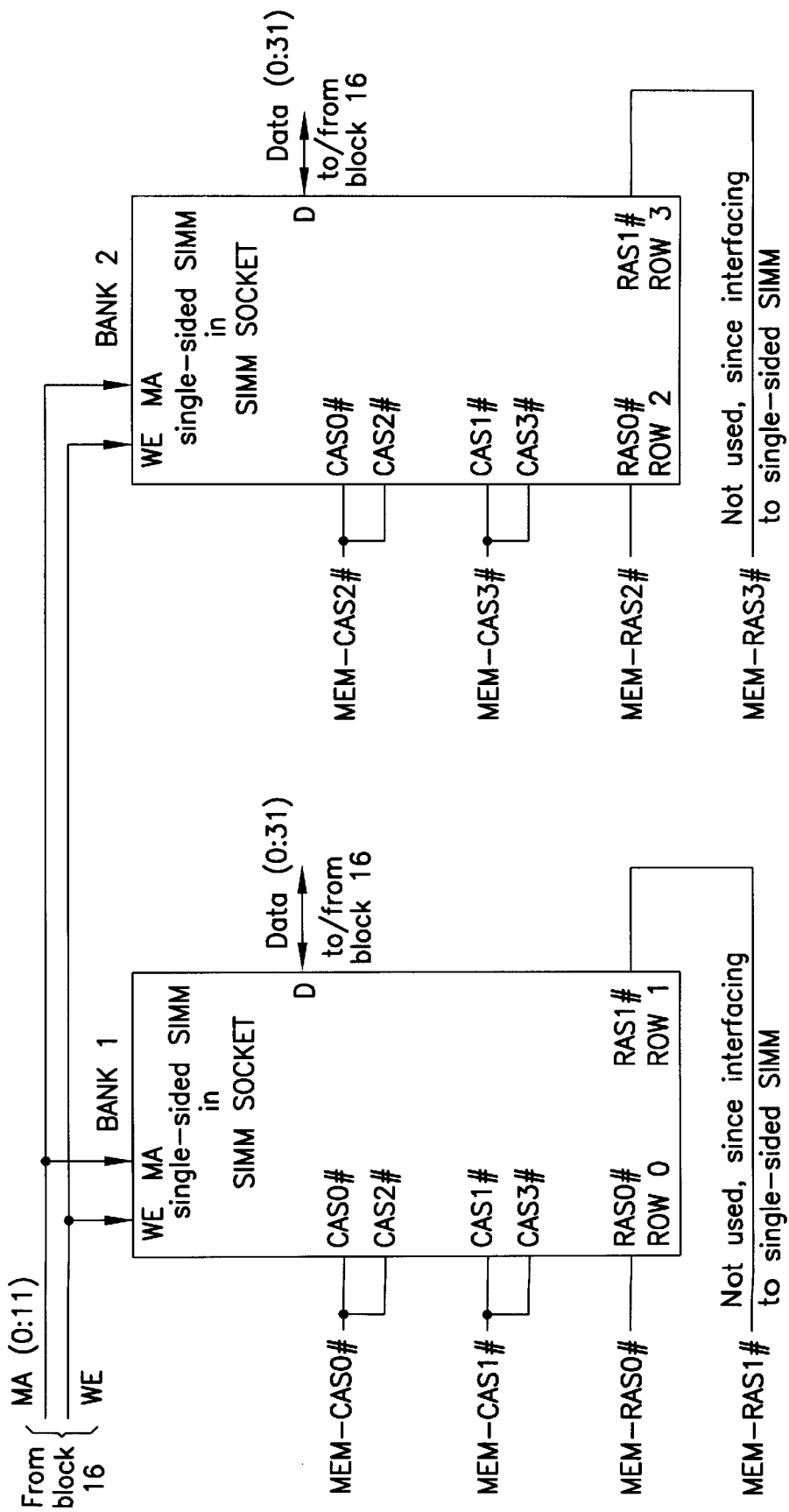
FIG. 5 is a block diagram showing memory address and control signal couplings between SIMM's mounted on two banks of the multiple bank memory board of FIG. 1, according to the prior art.

Referring now to FIG. 5, there is illustrated a block diagram showing data line and memory address and control signal couplings between the memory management system of the workstation or server and two SIMM's, each plugged into one of two banks (sockets 12) of the multiple bank memory board 10, according to the prior art. With two rows per socket 12, the memory control couplings reference rows 0, 1, 2, and 3, with rows 0 and 1 being in Bank 1 and rows 2 and 3 in Bank 2. The memory management system of the workstation or server containing the memory board 10 generates memory address and control signals to selectively access data stored in the DRAM's mounted on the SIMM's plugged into the sockets comprising Banks 1 and 2. Each memory access is used to either read data from or write data to one or more of the DRAM's via the data lines.

The memory address and control signals include a memory address MA, which, in the illustrated example, is a twelve bit address (11:0) for input to the DRAM memory array of a single row of a SIMM, to uniquely identify one storage location of one of the DRAM's mounted in one of the rows of the SIMM. In addition, the total memory address generated by the memory management system of the workstation or server includes a row address portion to identify the row containing the DRAM to be accessed, and a column address portion to identify the column position within the row of the selected DRAM.

The control signals include a write enable signal WE, and memory row address strobe signals MEM-RAS0, MEM-RAS1, MEMRAS2 and MEM-RAS3, and memory column address strobe signals MEM-CAS0, MEM-CAS1, MEM-CAS2 and MEM-CAS3, generated by the memory management system from the respective memory address portions of the memory address. The WE signal is used during writes to the DRAM's, to enable write circuitry. An asserted one of the RAS signals, as determined from the row address portion of the memory address, enables the row containing the selected DRAM, and an asserted one of the CAS signals, as determined by the column address portion of the memory address, enables the column containing the selected DRAM.

Each of the plug-in sockets 12 includes pin connections (not shown) that couple the data lines and memory address and control signals to connectors of the connector element 22 of the respective SIMM, for transmission of the data to or from, and the memory address and control signals to the DRAM's. As shown schematically in FIG. 5, the plug-in socket/connector element arrangement provides a D input/output port, and MA, WE, RAS and CAS input ports in each of Bank 1 and Bank 2. The WE signal is coupled to WE input ports of each of Banks 1 and 2, and the MA is couple to MA input ports of each of Banks 1 and 2. The D input/output port of each SIMM mounting permits data transfers between the DRAM's and the memory management system of the workstation or server.

Moreover, as shown in FIG. 5, MEM-CAS0 is coupled to CAS0 and CAS2 input ports of Bank 1, and MEM-CAS1 is coupled to CAS1 and CAS3 input ports of Bank 1. MEM-RAS0 is coupled to RAS0 input port of Bank 1, corresponding to row 0, and MEM-RAS1 is coupled to RAS1 input port of Bank 1, corresponding to row 1. Similarly, MEM-CAS2 is coupled to CAS0 and CAS2 input ports of Bank 2, and MEM-CAS3 is coupled to CAS1 and CAS3 input ports of Bank 2. MEM-RAS2 is coupled to RAS0 input port of Bank 2, corresponding to row 2, and MEM-RAS3 is coupled to RAS1 input port of Bank 2, corresponding to row 3.

In a conventional memory control design, the RAS signal is generated from a high order bit of the total memory address. For example, if two rows of DRAM memory store a total of 16 megabytes of data, the RAS signal (RAS0 or RAS1) for the specific row of the SIMM is generated from address bit 24, the most significant address bit for 16 megabytes of memory. Because of a locality phenomenon in the storage of data (e.g., current data being accessed tends to be located in memory close to both data accessed previously and data to be accessed next), most accesses to memory for a given period of time will access the same row. This is because the most significant address bit 24 will be toggled to reference the next row only if the next memory location to be accessed is more than the remaining row length away, which may be 8 megabytes away (16 megabytes in two rows of 8 megabytes each).

Thus, a series of accesses must be interrupted periodically to precharge the DRAM's, as discussed above. In order to reduce access time, when double-sided SIMM's are mounted in the memory board, the bit used to generate one of the RAS signals, as between the two rows of a connector, is permutated to a lower position in the memory address, e.g., to address bit 15. Address bit 15 will be toggled more frequently than the highest order bit 24, e.g., after only 32 kilobytes of data locations, and therefore, related data will be stored in varying ones of two rows. Accordingly, one row can be precharged while the other row of the SIMM is being accessed.

However, in the embodiment shown in FIG. 5, single-sided SIMM's are plugged into the sockets of Banks 1 and 2. As discussed above, when single-sided SIMM's are mounted in a memory board, alternate rows are treated as being vacant because there are DRAM's on one side only of each SIMM. Thus, in the illustration of FIG. 5, MEM-RAS1 and MEM-RAS3 are not used during memory accesses, and the address bit used to toggle between contiguous rows cannot be used to reduce memory access times because each adjacent pair of rows includes a vacant row.

Figure 6:
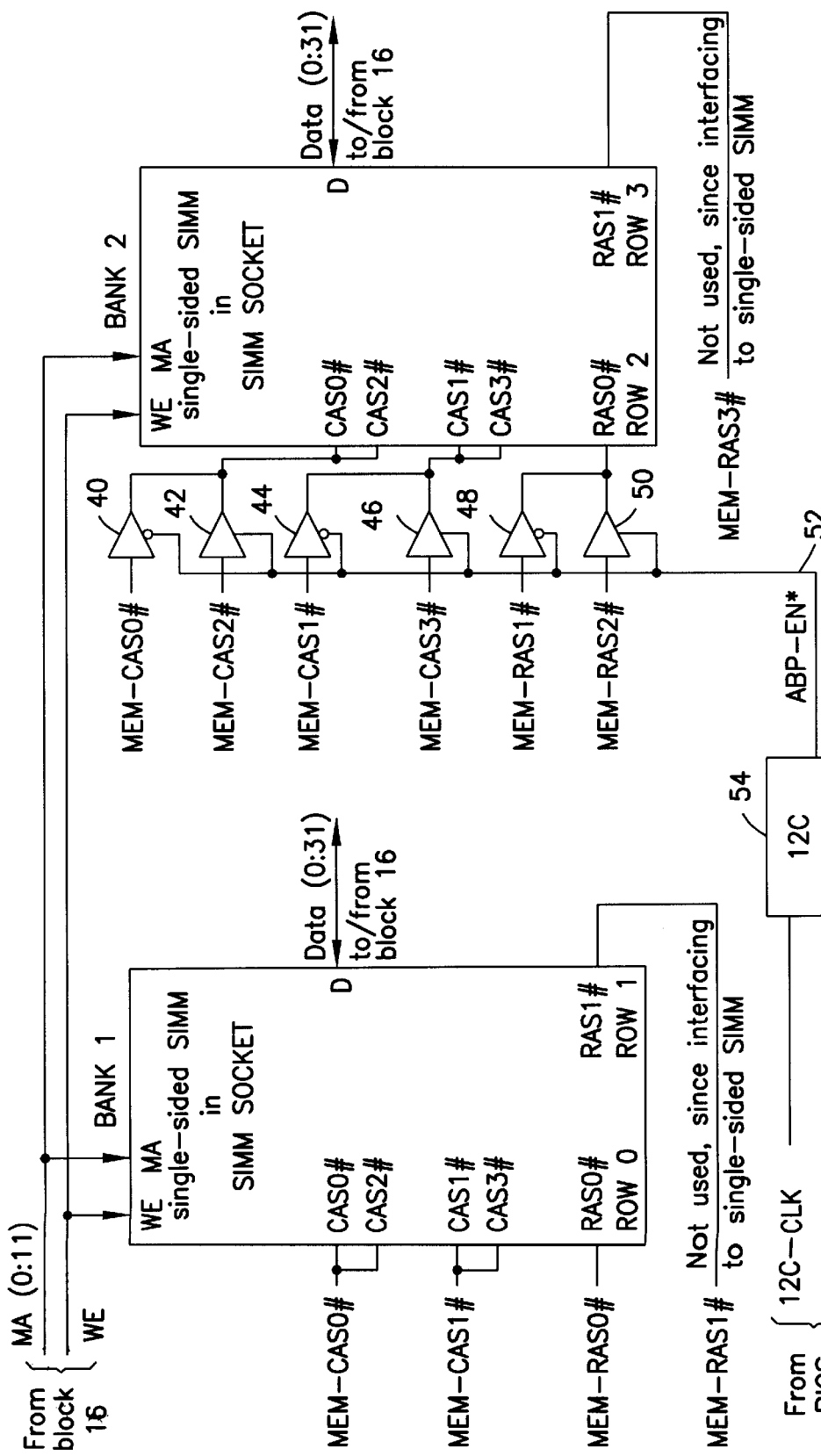
FIG. 6 is a block diagram of a embodiment of a multiplexer arrangement for coupling memory address and control signals to SIMM rows of the multiple bank memory board of FIG. 1, according to the present invention.

Referring now to FIG. 6, there is illustrated a block diagram of an embodiment of a mapping unit comprising a multiplexer arrangement for coupling memory address and control signals to SIMM rows of the multiple bank memory board of FIG. 1, according to the present invention. All of the memory management control signals MEM-CAS and MEM-RAS described with respect to FIG. 5 are present in the particular embodiment of the multiplexer arrangement of the present invention. In addition, in Bank 2, a series of multiplexers 40, 42, 44, 46, 48 and 50 are arranged to selectively route CAS and RAS signals from row 1 of Bank 1 to row 2 of Bank 2. In this manner, a mapping of row designations for row 1 of Bank 1 to row 2 of BANK 2 can be selected to provide a logical double-sided SIMM comprising two adjacent single-sided SIMM's, as will now be described.

Each of the MEM-CAS0, MEM-CAS1 and MEM-RAS1 signals, in addition to being coupled to Bank 1, is coupled to an input port of a corresponding one of the multiplexers 40, 44 and 48, respectively, in Bank 2. An output port of the multiplexer 40 is coupled to the CAS0 and CAS2 input ports of Bank 2. An output port of the multiplexer 44 is coupled to the CAS1 and CAS3 input ports of Bank 2. An output port of the multiplexer 48 is coupled to the RAS0 input port of Bank 2, corresponding to row 2.

Moreover, each of the MEM-CAS2, MEM-CAS3 and MEM-RAS2 signals, rather than being coupled directly to the respective Bank 2 input ports, is coupled to an input port of a corresponding one of the multiplexers 42, 46 and 50, respectively. An output port of the multiplexer 42 is coupled to the CAS0 and CAS2 input ports of Bank 2. An output port of the multiplexer 46 is coupled to the CAS1 and CAS3 input ports of Bank 2. An output port of the multiplexer 50 is coupled to the RAS0 input port of Bank 2, corresponding to row 2.

A multiplexer select line 52 is coupled directly to a select input port of each of the multiplexers 42, 46 and 50, and is coupled as a negated select signal to a select input port of each of the multiplexers 40, 44 and 48.

A controller 54 includes an address bit permutation enable output port ABP-EN* coupled to the select line 52. The controller 54, in turn, receives as input signals a clock CLK and an ENABLE DATA signal generated by operation of the BIOS of the workstation or server, as will be described with reference to the flow chart of FIG. 7. The controller 54 may comprise a PCF8574 CMOS circuit manufactured by Philips Semiconductor Corporation as a general purpose input/output (I/O) expansion device. The controller 54 generates ABP-EN* high or low, as a function of the BIOS ENABLE DATA signal. The controller 54 asserts ABP-EN* high, for example, when the BIOS detects double sided SIMM's in the memory board 10, and the address permutation scheme is to be used to reduce memory access times. When the ABP-EN* output signal by the controller 54 is high, the select line 52 selects the MEM-CAS2, MEM-CAS3 and MEM-RAS2 input ports to multiplexers 42, 46 and 50, respectively, for producing output signals by the multiplexers 42, 46 and 50, and input to the corresponding CAS0, CAS2; CAS1, CAS3; and RAS0 input ports of Bank 2.

However, in this particular embodiment of the present invention, when the BIOS detects single-sided SIMM's in the memory board 10, and determines that the address permutation scheme is to be used to reduce memory access times, the controller 54 asserts ABP-EN* low. A low ABP-EN* is negated for input as a high signal at the select input ports of multiplexers 40, 44 and 48, to thereby select the MEM-CAS0, MEM-CAS1 and MEM-RAS1 inputs to the multiplexers 40, 44, 48. This causes the outputs of the multiplexers 40, 44 and 48 (comprising the MEM-CAS0, MEM-CAS1 and MEM-RAS1 signals of Bank 1) to be input to the corresponding CAS0, CAS2; CAS1, CAS3; and RAS0 (row 2) input ports of Bank 2.

Thus, the multiplexing of the MEM-CAS0, MEM-CAS1 and MEM-RAS1 signals of Bank 1 to the corresponding input ports of Bank 2 turns two adjacent single-sided SIMM's (defining spaced rows 0 and 2)into a logical double-sided SIMM having logical adjacent rows. The memory management system of the workstation or server can reference rows 0 and 1 when addressing data locations, with the control signals relevant to row 0 being input to Bank 1 for access to the single-sided SIMM mounted in bank 1 and the control signals relevant to row 1 being multiplexed to the input ports of Bank 2 for access to row 2 occupied by the single-sided SIMM mounted in Bank 2. Accordingly, address bit 15 can be used to toggle the row designation since the logical address space treats spaced rows 0 and 2 as adjacent rows 0 and 1, and the address permutation scheme can be implemented during memory accesses to reduce memory access times.

Figure 7:
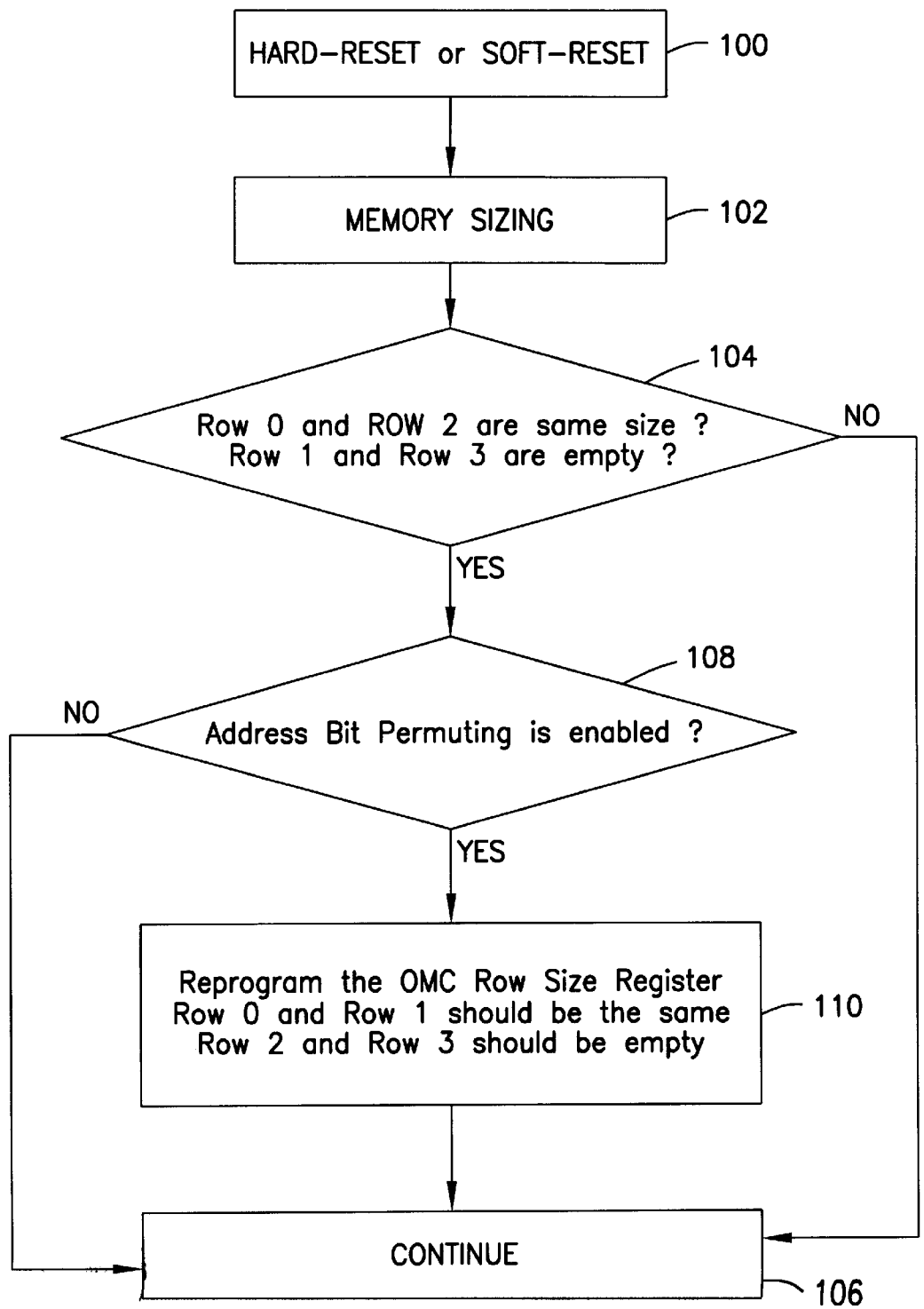
FIG. 7 is a flow chart for a portion of an embodiment of a BIOS poll routine according to the present invention.

FIG. 7 depicts a flow chart for a portion of an embodiment of a BIOS poll routine according to the present invention. At either a hard or soft reset 100, the BIOS undergoes a memory sizing routine 102 to determine the type and number of SIMM's plugged into the memory board 10, and the total memory capacity available to the workstation or server. After memory sizing has been completed, the BIOS determines at decision block 104, whether rows 0 and 2 are the same size, and whether rows 1 and 3 are empty.

In block 104, if the determination is no, the BIOS routine goes to continue block 106, which returns to normal operation of the workstation or server. If the determination is yes, this indicates the presence of two adjacent, equal sized single-sided SIMM's occupying rows 0 and 2 in adjacent plug-in type sockets 12 of the memory board 10. Thus, the multiplexing can be used to map the memory control signals ordinarily used for now vacant row 1 to row 2. The BIOS routine then proceeds to decision block 108 to determine whether the address bit permutation scheme is enabled for use to reduce memory access times.

In block 108, if the determination is no, the BIOS routine provides an ENABLE DATA signal that results in generation of the ABP-EN* high signal by the controller 54. The BIOS routine then goes to continue block 106. If the determination is yes, the BIOS goes to block 110 wherein the BIOS reprograms a memory row size register of the memory management system to indicate rows 0 and 1 are the same size, and to indicate that rows 2 and 3 are empty. This makes row 1 an alias for row 2 and provides the logical double-sided SIMM address space. The BIOS also provides an ENABLE DATA signal that results in the generation of the ABP-EN* low signal by the controller 54. After the routine of block 110, the BIOS goes to the continue block 106.

While certain features of the invention have been illustrated and described herein, many modifications, substitutions, changes and equivalents will occur to those skilled in the art. It is, therefore, to be understood that the appended claims are intended to cover all such modifications and changes as fall within the true spirit of the invention.

I claim:

1. A method to implement an address permutation scheme in a multiple bank memory, comprising the steps of:

providing first and second plug-in sockets in the multiple bank memory, each defining first and second memory rows to selectively mount one of a single-sided memory element and a double-sided memory element;

plugging single-sided memory elements into each of the first and second plug-in sockets to occupy the first row of the first socket and the first row of the second socket; and providing a logical double-sided memory element by mapping the single-sided memory elements onto a logical double-sided memory element address space as an alias address space for the single-sided memory elements;

said mapping including routing of memory control signals for the second row of the first plug-in socket to the first row of the second plug-in socket.

2. A multiple bank memory, comprising:

first and second memory banks;

a multiplexer having first and second input ports, an output port and a select input port;

a first memory control line coupled to the first memory bank and to the first input port of the multiplexer;

a second memory control line coupled to the second input port of the multiplexer;

the output port of the multiplexer coupled to the second memory bank; and a select line coupled to the select input port of the multiplexer to select one of the first memory control line and the second memory control line for output by the multiplexer to the second memory bank port, wherein each of the first and second memory banks comprises first and second rows of memory, the first memory control line being coupled to the second row of the first memory bank, and the output port of the multiplexer being coupled to the first row of the second memory bank for controllably mapping the first memory control line from the second row of the first memory bank to the first row of the second memory bank.

3. The multiple bank memory of claim 2, wherein each of the first and second memory banks comprises a plug-in socket adapted to mount one of a single-sided or double-sided plug-in memory element, a single-sided memory element plugged into a memory bank occupying the first row only of the memory bank, and a double-sided memory element plugged into a memory bank occupying the first and second rows of the memory bank, the multiplexer controllably mapping the first memory control line from the second row of the first memory bank to the first row of the second memory bank when single-sided memory elements are plugged into the first and second memory banks.

4. The multiple bank memory of claim 3 wherein the plug-in memory element comprises a single in-line memory module.

5. For use in a computer system having a multiple bank memory, each bank including a plug-in socket defining first and second adjacent memory rows, a mapping unit for mapping a memory control signal for the second row of a first socket adapted to mount one of a single-sided memory element and a double-sided memory element, to the first row of a second socket adapted to mount one of a single-sided memory element and a double-sided memory element, comprising:

a poll routine in the computer system to determine the existence of single-sided memory elements in each of the first socket and the second socket, and asserting a select signal when the determination is positive, and a multiplexer in the multiple bank memory having a select input port to receive the select signal from the poll routine and selectively coupling the memory control signal for the second row of the first socket to the first row of the second socket, as a function of the select signal.

6. The mapping unit of claim 5, wherein the poll routine comprises a basic input/output system.

7. A method for performing an address bit permutation in a computer system having a multiple bank memory, comprising the steps of:

providing first and second memory banks in the memory, each of the first and second banks comprising a plug-in socket including first and second memory rows;

selectively plugging in one of a single-sided memory element and a double-sided memory element in each of the plug-in sockets, a single-sided memory element plugged into the socket of a memory bank occupying the first row only of the memory bank, and a double-sided memory element plugged into the socket of a memory bank occupying the first and second rows of the memory bank;

polling the multiple bank memory to determine whether single-sided or double-sided memory elements are plugged into the sockets of the first and second memory banks;

selectively generating memory control signals for each of the first and second memory rows of each of the first and second memory banks;

routing the memory control signals for the second row of the first bank to the first row of the second bank when the polling determines that single-sided memory elements are plugged into the first and second memory banks; and performing an address bit permutation after routing the memory control signals for the second row of the first bank to the first row of the second bank.

8. A method for providing a logical double-sided memory space, comprising the steps of:

providing a multiple bank memory having first and second plug-in sockets each defining first and second memory rows;

plugging single-sided memory elements into each of the first and second plug-in sockets to occupy the first row of the first socket and the first row of the second socket;

generating memory control signals for the first and second rows of the first plug-in socket; and routing the memory control signals for the second row of the first bank to the first row of the second bank.

9. A logical double-sided memory element, comprising:

a multiple bank memory having first and second plug-in sockets each defining first and second memory rows;

a pair of single-sided memory elements, each plugged into a respective one of the first and second plug-in sockets, the first of the pair occupying the first row of the first socket, and the second of the pair occupying the first row of the second socket;

a first memory control line coupled to the first row of the first plug-in socket;

a second memory control line coupled to the second row of the first plug-in socket;

a third memory control line coupled to the first row of the second plug-in socket; and a fourth memory control line coupled to the second row of the second plug-in socket;

a multiplexer having first and second input ports, an output port and a select input port;

the second memory control line coupled to the first input port of the multiplexer;

the third memory control line coupled to the second input port of the multiplexer;

the output port of the multiplexer coupled to the first row of the second socket; and a select line coupled to the select input port of the multiplexer to route the second memory control line for output by the multiplexer to the first row of the second socket.

10. The logical double-sided memory element of claim 9, wherein each of the memory control lines is a multiple line arrangement transmitting row address strobe and column address strobe signals.

11. The logical double-sided memory element of claim 9, wherein each of the pair of single-sided memory elements comprises a single in-line memory module.

* * * * *